United States Patent
Reiter et al.

(10) Patent No.: US 12,014,963 B2
(45) Date of Patent: Jun. 18, 2024

(54) POWER SEMICONDUCTOR MODULE HAVING PROTRUSIONS AS FIXING STRUCTURES

(71) Applicant: Infineon Technologies AG, Neubiberg (DE)

(72) Inventors: Tomas Manuel Reiter, Munich (DE); Peter Bayer, Warstein (DE); Christoph Koch, Salzkotten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/362,088

(22) Filed: Jun. 29, 2021

(65) Prior Publication Data

US 2022/0415730 A1    Dec. 29, 2022

(51) Int. Cl.
*H01L 23/053* (2006.01)
*H01L 23/14* (2006.01)
(Continued)

(52) U.S. Cl.
CPC .......... *H01L 23/053* (2013.01); *H01L 23/145* (2013.01); *H01L 23/49503* (2013.01);
(Continued)

(58) Field of Classification Search
CPC . H01L 23/053; H01L 23/145; H01L 23/5286; H01L 23/12–15; H01L 2924/171–17798
See application file for complete search history.

(56) References Cited

U.S. PATENT DOCUMENTS

2012/0008286 A1    1/2012  Suzuki
2019/0229640 A1    7/2019  Aichriedler et al.
(Continued)

FOREIGN PATENT DOCUMENTS

WO    2013065849 A1    5/2013

OTHER PUBLICATIONS

"Cree Wolfspeed—CAB450M12XM3 1200V, 450A All-Silicon Carbide Conduction Optimized, Half-Bridge Module", Rev. A, Jun. 1, 2019, pp. 1-9.

*Primary Examiner* — Laura M Menz
*Assistant Examiner* — Candice Chan
(74) *Attorney, Agent, or Firm* — Murphy, Bilak & Homiller, PLLC

(57) ABSTRACT

A power semiconductor module includes: an electrically insulative frame having opposite first and second mounting sides, and a border that defines a periphery of the electrically insulative frame; a first substrate seated in the electrically insulative frame; a plurality of power semiconductor dies attached to the first substrate; a plurality of signal pins attached to the first substrate and electrically connected to the power semiconductor dies; a plurality of busbars attached to the first substrate and extending through the border of the electrically insulative frame; a plurality of fixing positions at the first mounting side of the electrically insulative frame; and a plurality of electrically insulative protrusions jutting out from the second mounting side of the electrically insulative frame, wherein the protrusions are vertically aligned with the fixing positions. Methods of producing the power semiconductor module and power electronic assemblies that incorporate the power semiconductor module are also described.

9 Claims, 7 Drawing Sheets

(51) Int. Cl.
*H01L 23/495* (2006.01)
*H01L 23/528* (2006.01)
*H05K 3/40* (2006.01)
*H05K 3/32* (2006.01)

(52) U.S. Cl.
CPC ............ H01L 23/5286 (2013.01); H05K 3/40 (2013.01); *H05K 3/32* (2013.01)

(56) References Cited

U.S. PATENT DOCUMENTS

2022/0130740 A1\* 4/2022 Yang .................... H01L 25/072
2022/0301998 A1\* 9/2022 Noderer ............ H01L 23/49811

\* cited by examiner

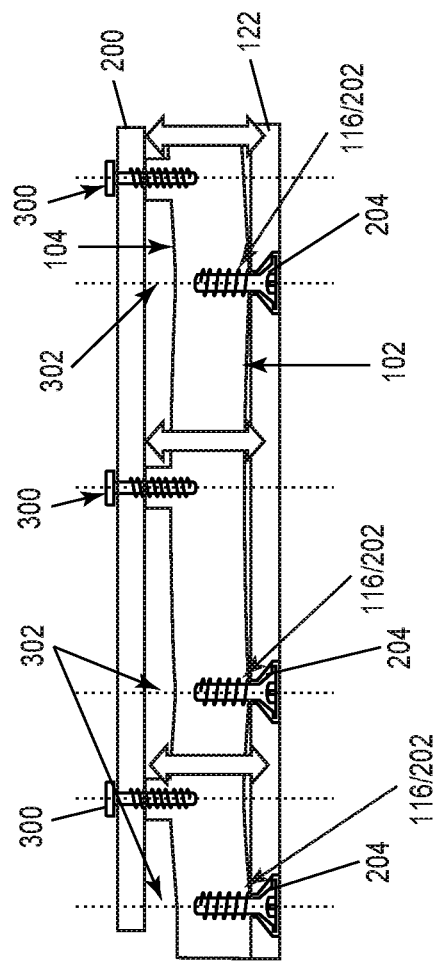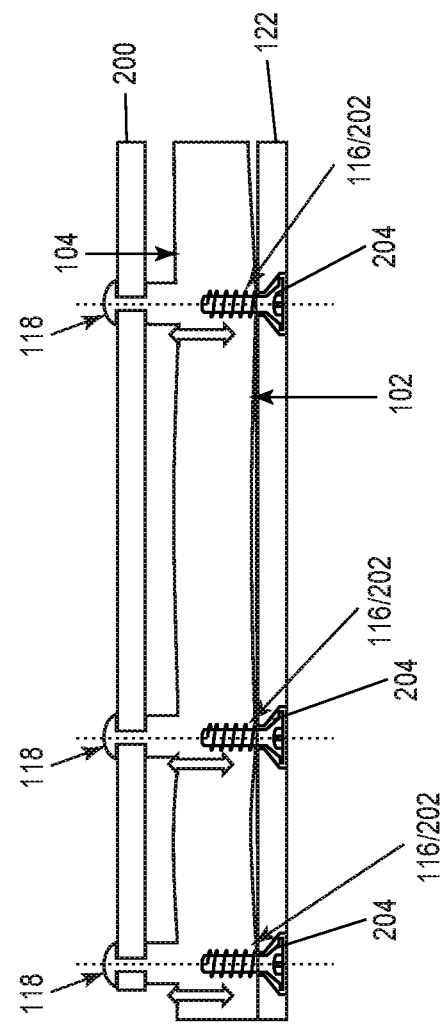
*Figure 3A*
*Figure 3B*

POWER SEMICONDUCTOR MODULE HAVING PROTRUSIONS AS FIXING STRUCTURES

BACKGROUND

Power semiconductor modules are typically attached to a printed circuit board (PCB) at one side using screws and to a base plate at the opposite side also using screws, to form a power electronic assembly. The PCB includes the control circuitry for the power semiconductor module and the base plate provides an efficient heat dissipation path. The screws for fixing the PCB cannot be stacked or vertically aligned with the screws for fixing the base plate, resulting in different mounting positions for the PCB compared to the base plate mounting positions. Due to deflections on the frame of the power semiconductor module during assembly processes and over thermal cycling, the height tolerance for the PCB is much higher (typically 0.4 mm) compared to the standard plastic tolerance for PCBs (typically 0.1 mm). This additional height tolerance results in high PCB strain, which presents a damage risk for components attached to the PCB that are sensitive to strain such as multilayer ceramic capacitors (MLCC). Also, special types of screws are used for attaching the power semiconductor module to a PCB and a base plate, increasing the overall cost of the resulting power electronic assembly. The screws are metal and therefore electrically conductive which means that high voltage potentials on the PCB must be spaced sufficiently from the screws to satisfy clearance and creepage distance requirements, increasing the overall size of the power electronic assembly.

Thus, there is a need for new fixing technique for power semiconductor modules.

SUMMARY

According to an embodiment of a power semiconductor module, the power semiconductor module comprises: an electrically insulative frame having a first mounting side, a second mounting side opposite the first mounting side, and a border that defines a periphery of the electrically insulative frame; a first substrate seated in the electrically insulative frame; a plurality of power semiconductor dies attached to the first substrate; a plurality of signal pins attached to the first substrate and electrically connected to the power semiconductor dies; a plurality of busbars attached to the first substrate and extending through the border of the electrically insulative frame; a plurality of fixing positions at the first mounting side of the electrically insulative frame; and a plurality of electrically insulative protrusions jutting out from the second mounting side of the electrically insulative frame, wherein the plurality of electrically insulative protrusions is vertically aligned with the plurality of fixing positions.

According to an embodiment of a power electronic assembly, the power electronic assembly comprises: a power semiconductor module; a metal base plate attached to a first mounting side of the power semiconductor module at a plurality of first fixing positions; and a circuit board attached to a second mounting side of the power semiconductor module opposite the first mounting side at a plurality of second fixing positions, wherein a plurality of electrically insulative protrusions jut out from the second mounting side of the power semiconductor module, wherein the plurality of electrically insulative protrusions is vertically aligned with the plurality of first fixing positions.

According to an embodiment of a method of producing a power electronic assembly, the method comprises: attaching a metal base plate attached to a first mounting side of a power semiconductor module at a plurality of first fixing positions; and attaching a circuit board to a second mounting side of the power semiconductor module opposite the first mounting side at a plurality of second fixing positions, wherein attaching the circuit board to the second mounting side of the power semiconductor module comprises: inserting a plurality of electrically insulative protrusions jutting out from the second mounting side at the plurality of second fixing positions into a plurality of corresponding openings in the circuit board; and after the inserting, deforming a distal end of the plurality of electrically insulative protrusions, wherein the plurality of electrically insulative protrusions is vertically aligned with the plurality of first fixing positions.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A and 3B illustrate partial cross-sectional views of the difference in stresses that arise during the power electronic assembly process for the case of vertical alignment and non-vertical alignment of the circuit board and base plate fixing structures, respectively.

DETAILED DESCRIPTION

The embodiments described herein provide a new fixing technique for attaching a circuit board such as a PCB to one side of a power semiconductor module and a metal base plate to the opposite side of the module. The power semiconductor module has fixing positions at the base plate mounting side of the power module frame and electrically insulative protrusions jutting out from the circuit board mounting side of the power module frame. The electrically insulative protrusions are provided for attaching the circuit board to power semiconductor module. The electrically insulative protrusions are vertically aligned with the base plate fixing positions at the opposite side of the power module frame.

With such a vertical alignment between the electrically insulative protrusions and the base plate fixing positions of the power semiconductor module, no air gap is present between the power semiconductor module and the circuit board in the regions of the circuit board mounting side that are vertically aligned with the base plate fixing positions at the opposite side of the module frame. With this configuration, circuit board strain is highly concentrated/localized to the board fixing positions of the power semiconductor module and therefore the only height tolerance outside the immediate vicinity of the board fixing positions comes from the plastic part of the circuit board which is typically between 0.05 to 0.1 mm in the case of a PCB. A height tolerance of only 0.05 to 0.1 mm at the circuit board mounting side of the power electronic assembly minimizes circuit board strain at this side of the assembly, freeing up more circuit board surface area for accommodating strain-sensitive components such as MLCC capacitors. Furthermore, by using electrically insulative protrusions to secure the circuit board to the power semiconductor module, metal traces (lines) on the circuit board can be routed much closer to the board fixing positions of the power semiconductor module as compared to if steel screws were instead used to fix the circuit board to the power module. The electrically insulative protrusions jutting out of the power module frame also enable easier assembly as the protrusions act as pre-alignment guiding elements when a PCB is attached to power module during assembly. Furthermore, the electrically insulative protrusions jutting out of the power module frame may be placed in such way that wrong assembly orientation of a PCB is not possible, e.g., an asymmetric or so-called poka-yoke configuration.

Described next, with reference to the figures, are exemplary embodiments of the power semiconductor module fixing technique, method of production, and corresponding power electronic assembly produced from the power semiconductor module.

Figure 1A:
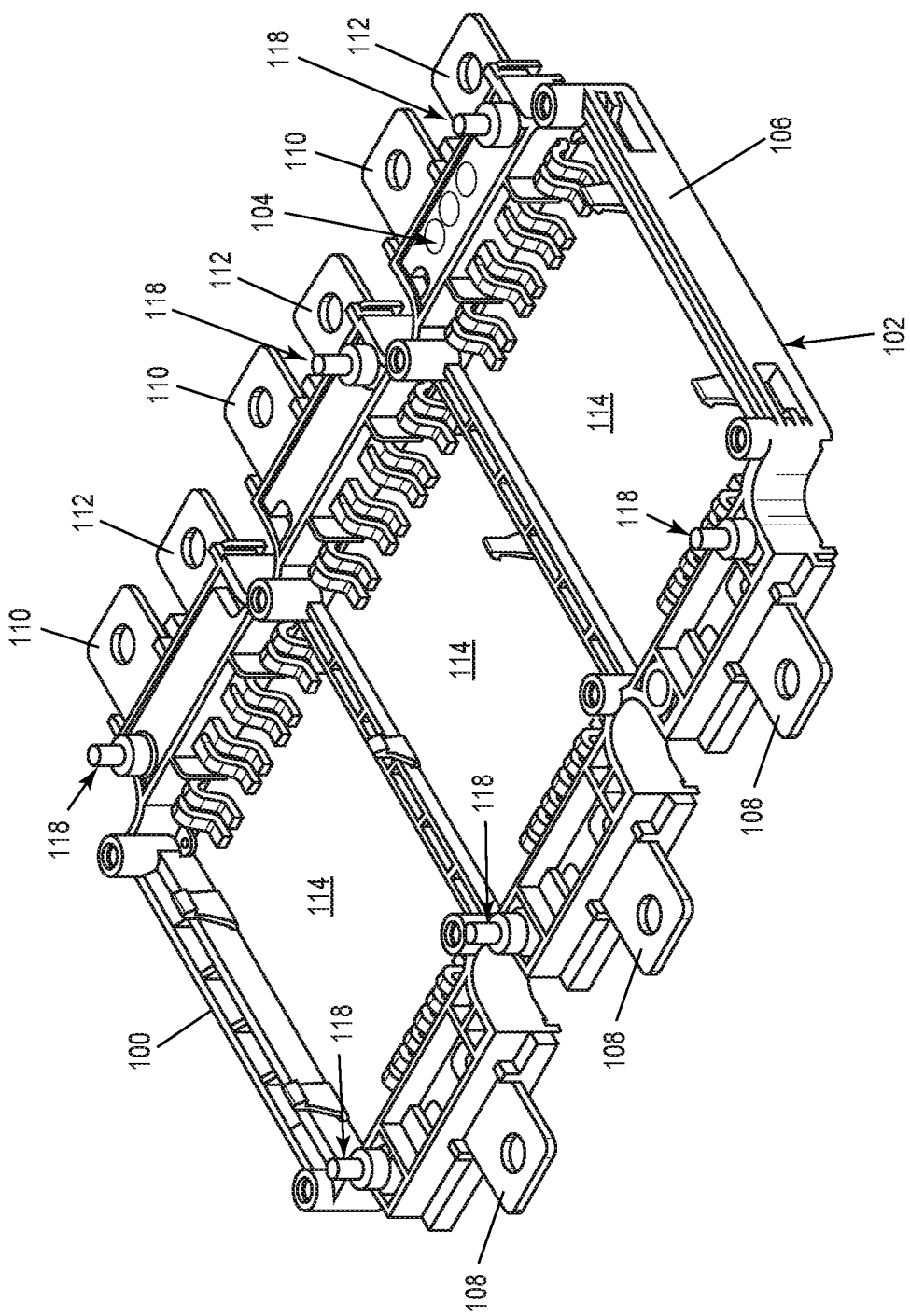
FIGS. 1A and 1B illustrate side perspective views of an embodiment of producing a power semiconductor module having a circuit board fixing structure.
Figure 1B:
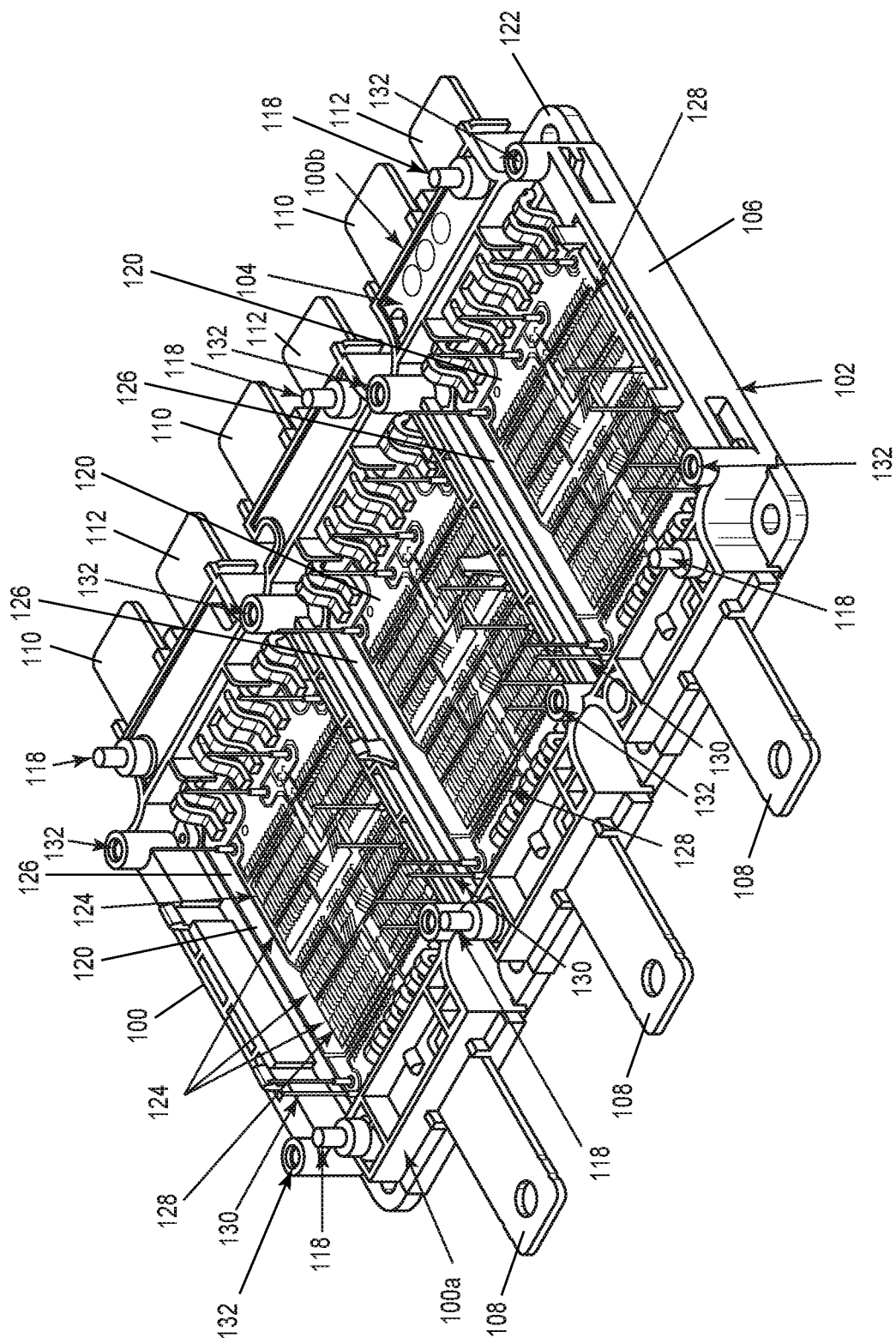

FIGS. 1A through 1B illustrate an embodiment of producing a power semiconductor module. The power semiconductor module may be designed, e.g., for use as a DC/AC inverter, a DC/DC converter, an AC/DC converter, a DC/AC converter, an AC/AC converter, or the like.

FIG. 1A illustrates a side perspective view of an electrically insulative frame 100 of the power semiconductor module. The electrically insulative frame 100 has a first (base plate) mounting side 102, a second (circuit board) mounting side 104 opposite the base plate mounting side 102, and a border 106 that defines the periphery of the electrically insulative frame 100. Busbars 108, 110, 112 extend from an interior 114 of the electrically insulative frame through the border 106 of the electrically insulative frame 100.

Base plate fixing positions 116, which are out of view in FIGS. 1A and 1B, are provided at the base plate mounting side 102 of the electrically insulative frame 100. The base plate fixing positions 116 are configured to facilitate attachment of a base plate to the power semiconductor module at the base plate mounting side 102 of the electrically insulative frame 100.

Electrically insulative protrusions 118 are formed as an integral part of the electrically insulative frame 100 and jut out from the opposite mounting side 104 of the electrically insulative frame 100 as the base plate mounting side 102. That is, the electrically insulative protrusions 118 extend or project out from the circuit board mounting side 104 of the electrically insulative frame 100. The electrically insulative protrusions 118 are configured to facilitate attachment of a circuit board such as a PCB to the power semiconductor module at the circuit board mounting side 104 of the electrically insulative frame 100. The terms 'circuit board' and 'PCB' are used interchangeably herein in referring to a board that mechanically supports and electrically connects electronic components using conductive tracks, pads and other features etched from one or more sheet layers of copper laminated onto and/or between sheet layers of a non-conductive substrate. The electrically insulative protrusions 118 at the circuit board mounting side 104 of the electrically insulative frame 100 are vertically aligned with the base plate fixing positions 116 at the base plate mounting side 102. The electrically insulative protrusions 118 jutting out of the power module frame 100 also enable easier assembly as the protrusions 118 act as pre-alignment guiding elements when a circuit board is attached to power module during assembly. Furthermore, the electrically insulative protrusions 118 jutting out of the power module frame 100 may be placed in such way that wrong assembly orientation of a circuit board is not possible, e.g., an asymmetric or so-called poka-yoke configuration. That is, the electrically insulative protrusions 118 permit circuit board placement only in a single orientation.

In one embodiment, the electrically insulative frame 100 comprises plastic and the electrically insulative protrusions 118 are protrusions of the plastic that jut out from the circuit board mounting side 104 of the electrically insulative frame 100. For example, the plastic may be a molding compound and the electrically insulative frame 100 may be formed by injection molding, transfer molding, compression molding, film-assist molding, lamination, etc. The molding compound may comprise a wide variety of electrically insulating encapsulant materials including ceramics, epoxy materials and thermosetting plastics, to name a few. For example, the molding compound may be a thermoplastic. Other types of plastics may be used for the electrically insulative frame 100 of the power semiconductor module.

FIG. 1B illustrates the same side perspective view as FIG. 1A, but after at least one substrate 120 is seated in the electrically insulative frame 100. According to this embodiment, a metal base plate 122 is attached to the mounting side 102 of the electrically insulative frame 100 opposite the circuit board mounting side 104. The metal base plate 122 is attached to the mounting side 102 at the base plate fixing positions 116. In other embodiments, the power semiconductor module may be provided without the metal base plate 122 pre-attached.

In either case, each substrate 120 seated in the electrically insulative frame 100 of the power semiconductor module has a plurality of power semiconductor dies 124 attached to the substrate 120. Depending on the application for which the power semiconductor module is designed, additional power semiconductor dies 124 may be attached to one or more additional substrates 120. For example, in the case of a 3-phase inverter or converter, the power semiconductor module may include 3 substrates 120 each having a plurality of power semiconductor dies 124 that are electrically connected to implement a phase of the inverter/converter. Again, the power semiconductor module may support more or fewer phases.

Each substrate 120 seated in the electrically insulative frame 100 of the power semiconductor module may be a DCB (direct copper bonded) substrate, an AMB (active metal brazed) substrate, an IMS (insulated metal substrate), etc. In each case, each substrate 120 may have a patterned metallized surface 126 that provides part of the electrical interconnections between the semiconductor dies 124 of the same group. Each group of semiconductor dies 124 may be electrically interconnected, e.g., via bond wires 128 and the patterned metallized surface 126 of the corresponding substrate 120 to form, e.g., a half bridge also commonly referred to as H-bridge.

In the example shown in FIGS. 1A and 1B, the power semiconductor module is designed for use as a 3-phase inverter and 3 half bridges are realized by the respective groups of semiconductor dies 124. More than one semiconductor die 124 from the same group may be coupled in parallel to provide higher current handling capability. Each half bridge has a phase output that is electrically coupled to a corresponding phase busbar 108. Each phase busbar 108 extends from the corresponding substrate 120 through a side face 100a of the electrically insulative frame 100 in which each substrate 120 is seated. Respective power (voltage) and ground busbars 110, 112 extend through a different side face 100b of the electrically insulative frame 100 and provide voltage and ground, respectively, to the corresponding groups of semiconductor dies 124.

The type and number of semiconductor dies 124 attached to each substrate 120 may depend on the application for which the power semiconductor module is designed. For example, the semiconductor dies 124 may be power MOSFET (metal-oxide-semiconductor field-effect transistor) dies, HEMT (high-electron mobility transistor) dies, IGBT (insulated gate bipolar transistor) dies, power diode dies, etc.

In each case, respective signal pins 130 are attached to each substrate 120 and are electrically connected to the corresponding group of power semiconductor dies 124, e.g., via the patterned metallized surface 124 of the corresponding substrate 120 and one or more bond wires 128. The signal pins 130 provide control signalling such as gate signals to the respective groups of power semiconductor dies 124, and may provide other functionality such as telemetry signalling, error signalling, etc. According to the embodiment illustrated in FIGS. 1A and 1B, the signal pins 130 vertically extend away from the respective substrates 120. Further according to the embodiment illustrated in FIGS. 1A and 1B, the electrically insulative frame 100 may have openings 132 in the circuit board mounting side 104 and that are laterally spaced apart from the electrically insulative protrusions 118. The openings 132 in the circuit board mounting side 104 of the electrically insulative frame 100 provide a redundant option for attaching a circuit board to the power semiconductor module using screws. The electrically insulative protrusions 118 jutting out of the power module frame 100 also enable easier assembly as the protrusions 118 act as pre-alignment guiding elements when a circuit board is attached to the power module during assembly. Furthermore, the electrically insulative protrusions 118 jutting out of the power module frame 100 may be placed in such way that wrong assembly orientation of a circuit board is not possible, e.g., an asymmetric or so-called poka-yoke configuration. That is, the electrically insulative protrusions 118 permit circuit board placement only in a single orientation.

Figure 2A:
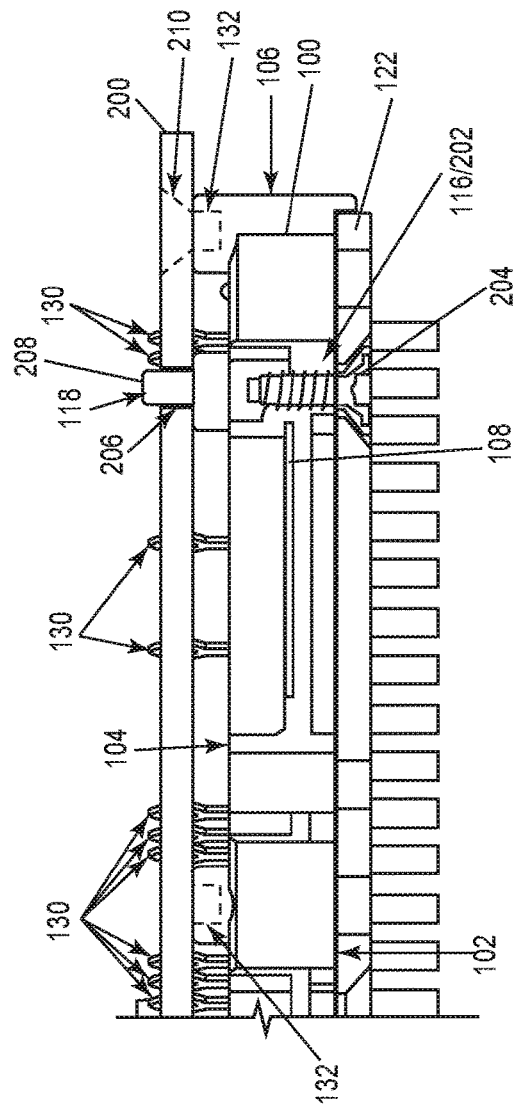
FIGS. 2A and 2B illustrate partial cross-sectional views of an embodiment of a method of producing a power electronic assembly from the power semiconductor module produced by FIGS. 1A and 1B.
Figure 2B:
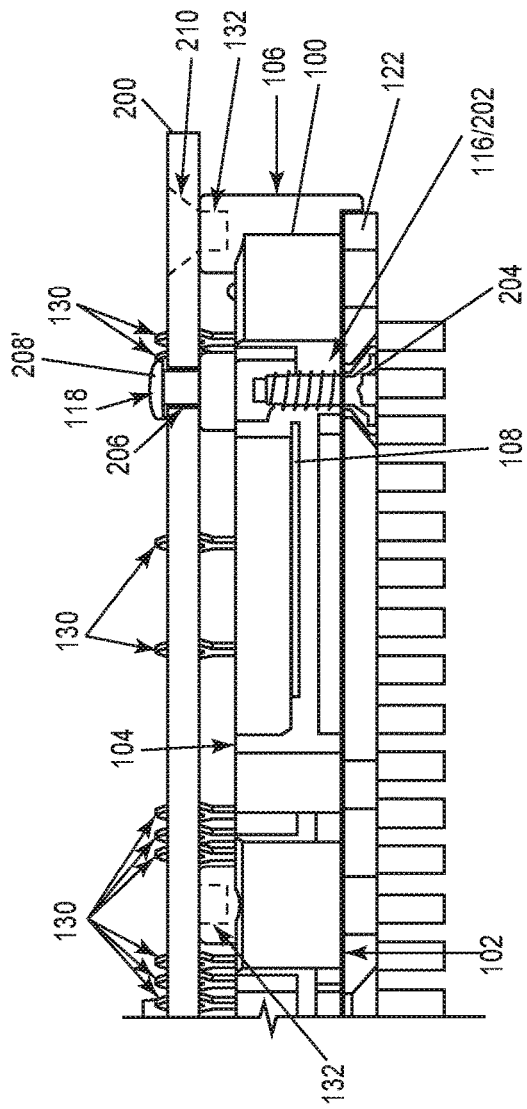

FIGS. 2A and 2B illustrate partial cross-sectional views of the power semiconductor module during attachment of a PCB 200 to form a power electronic assembly, taken through the border 106 of the module 100. As described above, the power electronic assembly may be a DC/AC inverter, a DC/DC converter, an AC/DC converter, a DC/AC converter, an AC/AC converter, or the like.

FIG. 2A shows the metal base plate 122 attached to the base plate mounting side 102 of the power semiconductor module at the base plate fixing positions 116 and the PCB 200 aligned with the circuit board mounting side 104 of the module. The metal base plate 122 may be a metal block, fined, water-cooled, etc. The PCB 200 may be a single-layer or multi-layer PCB. Components such as semiconductor dies, resistors, capacitors, etc. may be attached to one or both main sides of the PCB 200. For example, control circuitry such as a microcontroller, etc. may be attached to the PCB 200 for controlling the switching state of the power semiconductor dies 124 included in the power semiconductor module.

According to an embodiment, openings 202 are formed at the base plate fixing positions 116 of the electrically insulative frame 100 of the power semiconductor module and fasteners 204 such as screws are inserted in the openings 202 to attach the metal base plate 122 to the base plate mounting side 102 of the electrically insulative frame 100 at the base plate fixing positions 116. The electrically insulative frame 100 delimits the circuit board mounting side 104 and the base plate mounting side 102 of the power semiconductor module, as shown in FIGS. 2A and 2B.

The PCB 200 also has openings 206 into which the electrically insulative protrusions 118 at the circuit board mounting side 104 of the electrically insulative frame 100 of the power semiconductor module are inserted during production of the power electronic assembly. The openings 206 in the PCB 200 are sized to receive at least the distal end 208 of the electrically insulative protrusions 118 of the power module frame 100.

FIG. 2B shows the power electronic assembly after deforming the distal end 208 of the electrically insulative protrusions 118 at the circuit board mounting side 104 of the power module frame 100. As previously described herein, the electrically insulative frame 100 of the power semiconductor module may be made of plastic. In this case, the distal end 208 of the electrically insulative protrusions 118 of the power module frame 100 may be deformed by a tool that presses against and heats the distal end 208 of the electrically insulative protrusions 118. The tool may also cool the distal end 208 of the electrically insulative protrusions 118 after the deforming.

In each case, the deformed distal end 208' of the electrically insulative protrusions 118 at the circuit board mounting side 104 of the power module frame 100 attach the PCB 200 to the power semiconductor module. As previously described herein, the electrically insulative protrusions 118 at the circuit board mounting side 104 of the power module frame 100 are vertically aligned with the base plate fixing positions 116 at the base plate mounting side 102 of the power module frame 100. Accordingly, the interface between the metal base plate 122 and the base plate mounting side 102 of the power semiconductor module and the interface between the circuit PCB 200 and the circuit board mounting side 104 of the power semiconductor module are both devoid of gaps in a region where the electrically insulative protrusions 118 of the power module frame 100 are vertically aligned with the base plate fixing positions 116 of the power module frame 100.

The circuit board mounting side 104 of the power module frame 100 may have openings 132 as previously described herein at PCB fixing positions and laterally spaced apart from the electrically insulative protrusions 118. The PCB 200 may be attached to the power semiconductor module by fasteners 210 such as screws inserted into the openings 132 in the circuit board mounting side 104 of the power module frame 100. Depending on available tooling capability, either circuit board fixing mechanism—electrically insulative protrusions 118 or fasteners 210—may be used for attaching the PCB 200 to the power semiconductor module. If deformation of the electrically insulative protrusions 118 at the circuit board mounting side 104 of the power module frame 100 is the preferred PCB attachment mechanism, the fasteners 210 may be omitted which reduces creepage and clearance constraints in the attachment regions of the PCB 200, as previously described herein, reduces costs by omitting costly metal parts, and provides additional metal routing area on the PCB 200 for the same power module footprint.

In either case, vertically aligning the electrically insulative protrusions 118 at the circuit board mounting side 104 of the power module frame 100 with the base plate fixing positions 116 at the base plate mounting side 102 of the power module frame 100 eliminates gaps between the PCB 200 and the power module frame 100 in each region of the circuit board mounting side 104 vertically aligned with where the metal base plate 122 is attached to the electrically insulative frame 100. The electrically insulative protrusions 118 jutting out of the power module frame 100 also enable easier assembly as the protrusions act as pre-alignment guiding elements when the PCB 200 is attached to power module during assembly. Furthermore, the electrically insulative protrusions 118 jutting out of the power module frame 100 may be placed in such way that wrong assembly orientation of the PCB 200 is not possible, e.g., an asymmetric or so-called poka-yoke configuration. That is, the electrically insulative protrusions 118 permit placement of the PCB 200 only in a single orientation.

FIGS. 3A and 3B illustrate the difference in stresses that arise during the power electronic assembly process for the case of vertical alignment and non-vertical alignment of the electrically insulative protrusions 118 and the base plate fixing positions 116 of the power module frame 100.

Figure 4A:
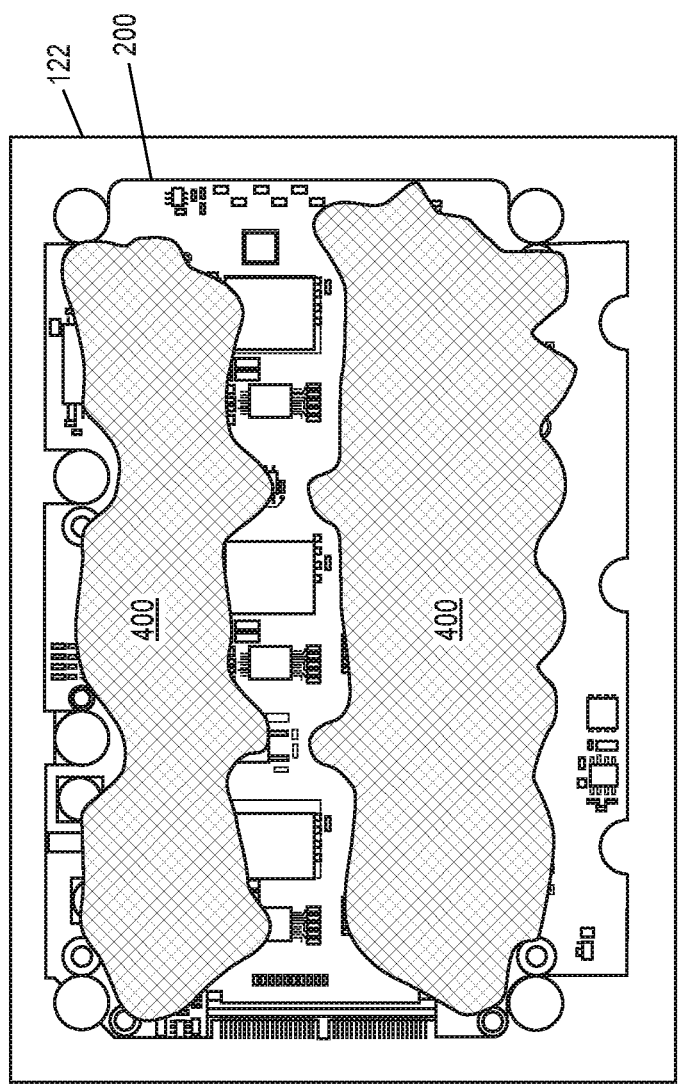
FIGS. 4A and 4B illustrate plan views of the difference in deformation/strain of the circuit board that arise during the power electronic assembly process for the case of vertical alignment and non-vertical alignment of the circuit board and base plate fixing structures, respectively.

FIG. 3A shows a scenario in which screws 300 are used to attach the PCB 200 to the power semiconductor module and the screw positions at the circuit board mounting side 104 of the power module are not vertically aligned with the base plate fixing positions 116 at the base plate mounting side 102 of the power module frame 100. In this case, a gap 302 is present between the PCB 200 and the power module frame 100 in each region of the circuit board mounting side 104 vertically aligned with where the metal base plate 122 is attached to the electrically insulative frame 100. Stresses imparted by the PCB attachment and metal base plate attachment processes are indicated by the vertical dotted lines in FIG. 3A. The stresses are not vertically aligned, and owning to the gaps 302 between the PCB 200 and power module frame 100 in each region of the circuit board mounting side 104 where the metal base plate 122 is attached to the electrically insulative frame 100, the PCB 200 is subjected to extensive deformation forces as indicated by the large vertical arrows and the large areas of cross-hatching 400 in FIG. 4A. The cross-hatched areas 400 in FIG. 4A represent strained areas of the PCB 200 having a deformation above 800 µm/m. Accordingly, the height tolerance for the PCB 200 is at least 0.4 mm in the highly strained areas 400 which is problematic for mounting of strain-sensitive components such as MLCC capacitors.

FIG. 3B shows a scenario in which the electrically insulative protrusions 118 at the circuit board mounting side 104 of the power module frame 100 are vertically aligned with the base plate fixing positions 116 at the base plate mounting side 102 of the power module frame 100. In this case, no gap is present between the PCB 200 and the power module frame 100 in each region of the circuit board mounting side 104 vertically aligned with where the metal base plate 122 is attached to the electrically insulative frame 100. Accordingly, the stresses imparted by the PCB attachment and metal base plate attachment processes are vertically aligned as indicated by the vertical dotted lines in FIG. 3B. Also, a thick glue rope may be provided between the power module frame 100 and the metal base plate 122 at the base plate fixing positions 116.

Figure 4B:
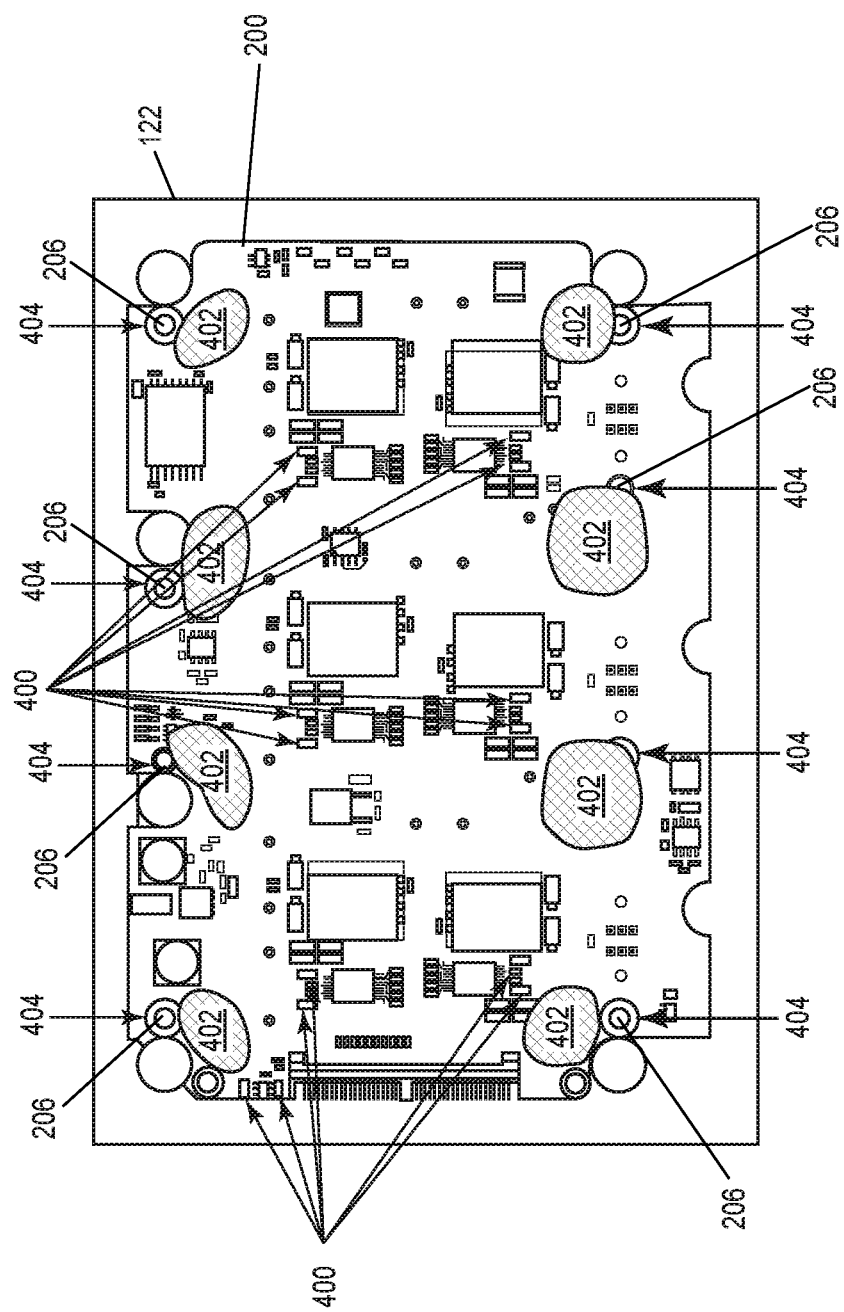

Moreover, since no gaps are present between the PCB 200 and the power module frame 100 in each region of the circuit board mounting side 104 vertically aligned with where the metal base plate 122 is attached to the electrically insulative frame 100, the PCB 200 is subjected to less deformation forces as indicated by the small vertical arrows and the small areas of cross-hatching 402 in FIG. 4B. Also, the deformation that does occur is highly localized to the PCB fixing positions 404 as indicated in FIG. 4B.

As is the case in FIG. 4A, the cross-hatched areas 402 in FIG. 4B represent strained areas of the PCB 200 having a deformation above 800 µm/m. The total area of problematic deformation is reduced by well over 50% in FIG. 4B compared to FIG. 4A. Accordingly, the only height tolerance outside the immediate vicinity of the PCB fixing positions comes from the plastic part of the PCB 200 which is typically between 0.05 to 0.1 mm, which allows for accommodating strain-sensitive components such as MLCC capacitors on the PCB 200. Other components such as semiconductor dies, resistors, etc. are shown in FIGS. 4A and 4B but not assigned a reference number to emphasize the area of deformation/strain involved and the area available in both scenarios for mounting strain-sensitive components such as MLCC capacitors to the PCB 200.

Figure 5A:
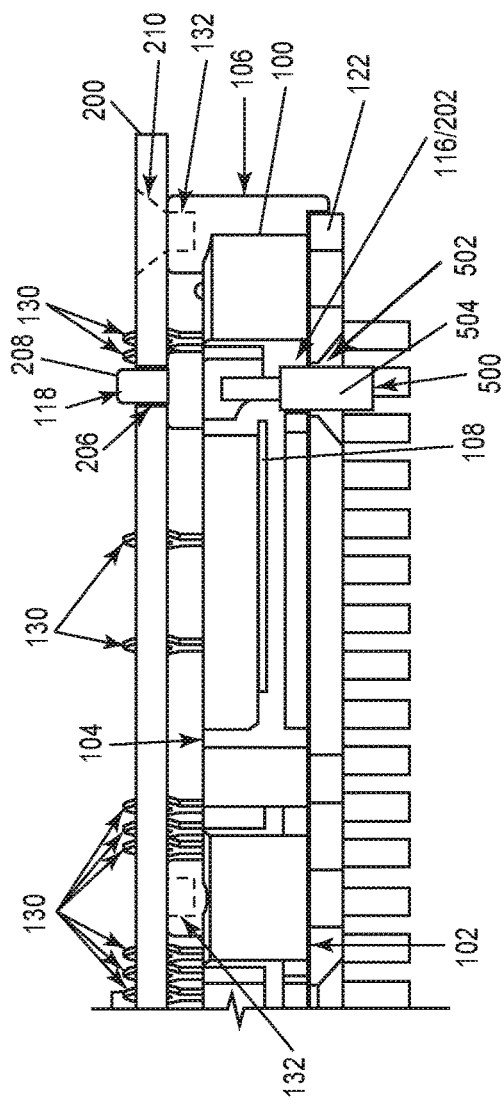
FIGS. 5A and 5B illustrate partial cross-sectional views of another embodiment of a method of producing a power electronic assembly from the power semiconductor module produced by FIGS. 1A and 1B.
Figure 5B:
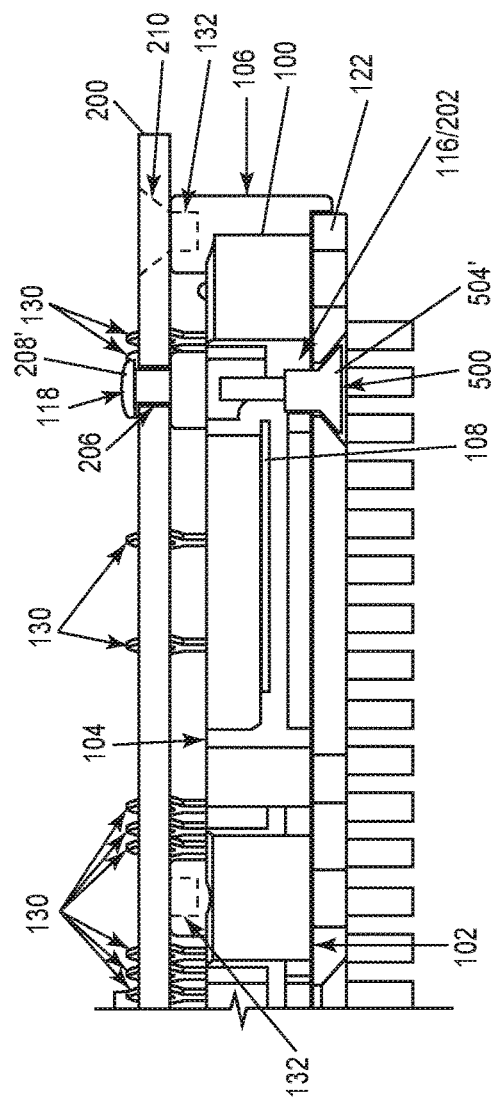

FIGS. 5A and 5B illustrate partial cross-sectional views of the power semiconductor module during attachment of the PCB 200 to form a power electronic assembly, according to another embodiment, and taken through the border 106 of the module 100. The power electronic assembly embodiment illustrated in FIGS. 5A and 5B is similar to the power electronic assembly embodiment illustrated in FIGS. 2A and 2B, respectively. Accordingly, the teachings described above with reference to FIGS. 2A and 2B also apply to the embodiment illustrated in FIGS. 5A and 5B.

Different than the power electronic assembly embodiment illustrated in FIGS. 2A and 2B, the electrically insulative frame 100 of the power semiconductor module in FIGS. 5A and 5B has additional protrusions 500 jutting out from the base plate mounting side 102 of the power module frame 100. The metal base plate 122 has openings 502 into which the electrically insulative protrusions 500 at the base plate mounting side 102 of the power module frame 100 are inserted during production of the power electronic assembly. The openings 502 in the metal base plate 122 are sized to receive at least the distal end 504 of the electrically insulative protrusions 500 at the base plate mounting side 102 of the power module frame 100.

FIG. 5B shows the power electronic assembly after deforming the distal end 504 of the electrically insulative protrusions 500 at the base plate mounting side 102 of the power module frame 100. As previously described herein, the electrically insulative frame 100 of the power semiconductor module may be made of plastic. In this case, the distal end 504 of the electrically insulative protrusions 500 at the base plate mounting side 102 of the power module frame 100 may be deformed by a tool that presses against and heats the distal end 504 of the electrically insulative protrusions 500. The tool may also cool the distal end 504 of the electrically insulative protrusions 500 after the deforming.

In each case, the deformed distal end 504' of the electrically insulative protrusions 500 at the base plate mounting side 102 of the power module frame 100 attach the metal base plate 122 to the power semiconductor module according to this embodiment. Further according to this embodiment, the protrusions 500 jutting out from the base plate mounting side 102 of the power module frame 100 are vertically aligned with the protrusions 118 jutting out from the circuit board mounting side 104 of the power module frame 100. Such a configuration reduces the strain/deformation of the PCB 200, as previously described herein in connection with FIGS. 3B and 4B.

Although the present disclosure is not so limited, the following numbered examples demonstrate one or more aspects of the disclosure.

Example 1. A power semiconductor module, comprising: an electrically insulative frame having a first mounting side, a second mounting side opposite the first mounting side, and a border that defines a periphery of the electrically insulative frame; a first substrate seated in the electrically insulative frame; a plurality of power semiconductor dies attached to the first substrate; a plurality of signal pins attached to the first substrate and electrically connected to the power semiconductor dies; a plurality of busbars attached to the first substrate and extending through the border of the electrically insulative frame; a plurality of fixing positions at the first mounting side of the electrically insulative frame; and a plurality of electrically insulative protrusions jutting out from the second mounting side of the electrically insulative frame, wherein the plurality of electrically insulative protrusions is vertically aligned with the plurality of fixing positions.

Example 2. The power semiconductor module of example 1, wherein the electrically insulative frame comprises plastic, and wherein the electrically insulative protrusions are protrusions of the plastic jutting out from the second mounting side of the electrically insulative frame.

Example 3. The power semiconductor module of example 2, wherein a plurality of protrusions of the plastic jut out from the first mounting side of the electrically insulative frame at the plurality of fixing positions, and wherein the plurality of protrusions of the plastic jutting out from the first mounting side of the electrically insulative frame is vertically aligned with the plurality of protrusions of the plastic jutting out from the second mounting side of the electrically insulative frame.

Example 4. The power semiconductor module of example 2 or 3, further comprising: a plurality of openings in the plastic at the plurality of fixing positions.

Example 5. The power semiconductor module of any of examples 1 through 4, wherein the electrically insulative protrusions are configured to allow attachment of a circuit board at the second mounting side of the electrically insulative frame only in a single orientation.

Example 6. The power semiconductor module of any of examples 1 through 5, further comprising: a metal base plate attached to the first mounting side of the electrically insulative frame at the plurality of fixing positions.

Example 7. The power semiconductor module of example 6, wherein the electrically insulative frame comprises plastic, and wherein the electrically insulative protrusions are protrusions of the plastic jutting out from the second mounting side of the electrically insulative frame.

Example 8. The power semiconductor module of example 7, wherein a plurality of protrusions of the plastic jut out from the first mounting side of the electrically insulative frame, wherein a distal end of the plurality of protrusions of the plastic jutting out from the first mounting side of the electrically insulative frame is deformed to attach the metal base plate to the first mounting side, and wherein the plurality of protrusions of the plastic jutting out from the first mounting side of the electrically insulative frame is vertically aligned with the plurality of protrusions of the plastic jutting out from the second mounting side of the electrically insulative frame.

Example 9. The power semiconductor module of example 7 or 8, further comprising: a plurality of openings in the plastic at the plurality of fixing positions; and a plurality of fasteners inserted in the plurality of openings and that attach the metal base plate to the first mounting side of the electrically insulative frame at the plurality of fixing positions.

Example 10. A power electronic assembly, comprising: a power semiconductor module; a metal base plate attached to a first mounting side of the power semiconductor module at a plurality of first fixing positions; and a circuit board attached to a second mounting side of the power semiconductor module opposite the first mounting side at a plurality of second fixing positions, wherein a plurality of electrically insulative protrusions jut out from the second mounting side of the power semiconductor module, wherein the plurality of electrically insulative protrusions is vertically aligned with the plurality of first fixing positions.

Example 11. The power electronic assembly of example 10, wherein the power semiconductor module comprises: an electrically insulative frame delimiting the first mounting side and the second mounting side of the power semiconductor module, and a border that defines a periphery of the power semiconductor module; a first substrate seated in the electrically insulative frame; a plurality of power semiconductor dies attached to the first substrate; a plurality of signal pins attached to the first substrate, electrically connected to the power semiconductor dies, protruding through the electrically insulative frame at the second mounting side of the power semiconductor module, and received by the circuit board; and a plurality of busbars attached to the first substrate and extending through the border of the power semiconductor module.

Example 12. The power electronic assembly of example 11, wherein the electrically insulative frame comprises plastic, and wherein the electrically insulative protrusions are protrusions of the plastic jutting out from the second mounting side of the power semiconductor module.

Example 13. The power electronic assembly of example 12, wherein a plurality of protrusions of the plastic jut out from the first mounting side of the power semiconductor module, wherein a distal end of the plurality of protrusions of the plastic jutting out from the first mounting side of the power semiconductor module is deformed to attach the metal base plate to the first mounting side, and wherein the plurality of protrusions of the plastic jutting out from the first mounting side of the power semiconductor module is vertically aligned with the plurality of protrusions of the plastic jutting out from the second mounting side of the power semiconductor module.

Example 14. The power electronic assembly of example 12 or 13, further comprising: a plurality of openings in the plastic at the plurality of first fixing positions; and a plurality of fasteners inserted in the plurality of openings and that attach the metal base plate to the first mounting side of the power semiconductor module at the plurality of first fixing positions.

Example 15. The power electronic assembly of any of examples 10 through 14, wherein the electrically insulative protrusions are configured to allow attachment of the circuit board to the second mounting side of the electrically insulative frame only in a single orientation.

Example 16. The power electronic assembly of any of examples 10 through 15, wherein the plurality of electrically insulative protrusions jut out from the second mounting side of the power semiconductor module at the plurality of second fixing positions, and wherein the circuit board is attached to the second mounting side of the power semiconductor module by the plurality of electrically insulative protrusions.

Example 17. The power electronic assembly of example 16, wherein an interface between the metal base plate and the first mounting side of the power semiconductor module and an interface between the circuit board and the second mounting side of the power semiconductor module are both devoid of gaps in a region where the plurality of electrically insulative protrusions is vertically aligned with the plurality of first fixing positions.

Example 18. A method of producing a power electronic assembly, the method comprising: attaching a metal base plate attached to a first mounting side of a power semiconductor module at a plurality of first fixing positions; and attaching a circuit board to a second mounting side of the power semiconductor module opposite the first mounting side at a plurality of second fixing positions, wherein attaching the circuit board to the second mounting side of the power semiconductor module comprises: inserting a plurality of electrically insulative protrusions jutting out from the second mounting side at the plurality of second fixing positions into a plurality of corresponding openings in the circuit board; and after the inserting, deforming a distal end of the plurality of electrically insulative protrusions, wherein the plurality of electrically insulative protrusions is vertically aligned with the plurality of first fixing positions.

Example 19. The method of example 18, wherein the power semiconductor module comprises: an electrically insulative frame delimiting the first mounting side and the second mounting side of the power semiconductor module, and a border that defines a periphery of the power semiconductor module; a first substrate seated in the electrically insulative frame; a plurality of power semiconductor dies attached to the first substrate; a plurality of signal pins attached to the first substrate, electrically connected to the power semiconductor dies, protruding through the electrically insulative frame at the second mounting side of the power semiconductor module, and received by the circuit board; and a plurality of busbars attached to the first substrate and extending through the border of the power semiconductor module, wherein the electrically insulative frame comprises plastic, wherein the electrically insulative protrusions are protrusions of the plastic jutting out from the second mounting side of the power semiconductor module.

Example 20. The method of example 18 or 19, wherein attaching the metal base plate to the first mounting side of the power semiconductor module comprises: inserting a plurality of electrically insulative protrusions jutting out from the first mounting side at the plurality of first fixing positions into a plurality of corresponding openings in the metal base plate; and after the inserting, deforming a distal end of the plurality of electrically insulative protrusions jutting out from the first mounting side.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
an electrically insulative frame having a first mounting side, a second mounting side opposite the first mounting side, and a border that defines a periphery of the electrically insulative frame;
a first substrate seated in the electrically insulative frame;
a plurality of power semiconductor dies attached to the first substrate;
a plurality of signal pins attached to the first substrate and electrically connected to the power semiconductor dies;
a plurality of busbars attached to the first substrate and extending through the border of the electrically insulative frame;
a plurality of fixing positions at the first mounting side of the electrically insulative frame and configured to facilitate attachment of a base plate to the power semiconductor module at the first mounting side of the electrically insulative frame; and
a plurality of electrically insulative protrusions jutting out from the second mounting side of the electrically insulative frame,
wherein the plurality of electrically insulative protrusions is vertically aligned with the plurality of fixing positions and configured to facilitate attachment of a circuit board to the power semiconductor module at the second mounting side of the electrically insulative frame.

2. The power semiconductor module of claim 1, wherein the electrically insulative frame comprises plastic, and wherein the electrically insulative protrusions are protrusions of the plastic jutting out from the second mounting side of the electrically insulative frame.

3. The power semiconductor module of claim 2, wherein a plurality of protrusions of the plastic jut out from the first mounting side of the electrically insulative frame at the plurality of fixing positions, and wherein the plurality of protrusions of the plastic jutting out from the first mounting side of the electrically insulative frame is vertically aligned with the plurality of protrusions of the plastic jutting out from the second mounting side of the electrically insulative frame.

4. The power semiconductor module of claim 2, further comprising:
a plurality of openings in the plastic at the plurality of fixing positions.

5. The power semiconductor module of claim 1, wherein the electrically insulative protrusions are configured to allow attachment of the circuit board at the second mounting side of the electrically insulative frame only in a single orientation.

6. The power semiconductor module of claim 1, further comprising:
   the base plate attached to the first mounting side of the electrically insulative frame at the plurality of fixing positions.

7. The power semiconductor module of claim 6, wherein the electrically insulative frame comprises plastic, and wherein the electrically insulative protrusions are protrusions of the plastic jutting out from the second mounting side of the electrically insulative frame.

8. The power semiconductor module of claim 7, wherein a plurality of protrusions of the plastic jut out from the first mounting side of the electrically insulative frame, wherein a distal end of the plurality of protrusions of the plastic jutting out from the first mounting side of the electrically insulative frame is deformed to attach the base plate to the first mounting side, and wherein the plurality of protrusions of the plastic jutting out from the first mounting side of the electrically insulative frame is vertically aligned with the plurality of protrusions of the plastic jutting out from the second mounting side of the electrically insulative frame.

9. The power semiconductor module of claim 7, further comprising:
   a plurality of openings in the plastic at the plurality of fixing positions; and
   a plurality of fasteners inserted in the plurality of openings and that attach the base plate to the first mounting side of the electrically insulative frame at the plurality of fixing positions.

\* \* \* \* \*